(12) United States Patent
Woo et al.

(10) Patent No.: US 6,633,083 B2
(45) Date of Patent: *Oct. 14, 2003

(54) BARRIER LAYER INTEGRITY TEST

(75) Inventors: Christy Mei-Chu Woo, Cupertino, CA (US); Young-Chang Joo, Seoul (KR); Todd Lukanc, San Jose, CA (US)

(73) Assignee: Advanced Micro Devices Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/514,413

(22) Filed: Feb. 28, 2000

(65) Prior Publication Data

US 2002/0151093 A1 Oct. 17, 2002

(51) Int. Cl.[7] ............................................. H01L 31/06
(52) U.S. Cl. ........................................ 257/751; 257/760
(58) Field of Search .................................. 257/751, 758, 257/760; 438/624, 626, 687, 627

(56) References Cited

U.S. PATENT DOCUMENTS

| | | | |
|---|---|---|---|
| 5,612,254 A | * | 3/1997 | Mu et al. |
| 5,872,053 A | * | 2/1999 | Smith |
| 5,889,328 A | * | 3/1999 | Joshi et al. |
| 5,891,513 A | * | 4/1999 | Dubin et al. |
| 5,969,422 A | * | 10/1999 | Ting et al. |
| 6,114,238 A | * | 9/2000 | Liao |
| 6,143,640 A | * | 11/2000 | Cronin et al. |
| 6,156,651 A | * | 12/2000 | Havemann |
| 6,165,891 A | * | 12/2000 | Chooi et al. |
| 6,181,013 B1 | * | 1/2001 | Liu et al. |
| 6,184,128 B1 | * | 2/2001 | Wang et al. |
| 6,218,318 B1 | * | 4/2001 | Ohkura et al. |

* cited by examiner

*Primary Examiner*—George Fourson
*Assistant Examiner*—Joannie Adelle Garcia
(74) *Attorney, Agent, or Firm*—Gerald M. Fisher; Deborah W. Wenocur

(57) ABSTRACT

A structure and method for determining barrier layer integrity for multi-level copper metallization structures in integrated circuit manufacturing. Novel testing structures prevent any conducting residues of the copper CMP from diffusing into the dielectric layer. Barrier layer integrity is tested by performing CV or IV measurements between the copper lines and the silicon wafer.

20 Claims, 3 Drawing Sheets

BARRIER LAYER INTEGRITY TEST

FIELD OF THE INVENTION

This invention deals with integrated circuit manufacturing processes and structures, and in particular to a process and structure for testing the integrity of a barrier layer for Cu metallization structures.

BACKGROUND OF THE INVENTION

As integrated circuit devices shrink, with semiconductor device geometries approaching 0.18 micron minimum feature size, and as circuit speed and performance increase, copper has replaced aluminum as the preferred electrical interconnect material. The use of copper as an interconnect material in silicon integrated circuits has occurred in response to the need for lowered interconnect resistivity, good electromigration resistance, and good deposition characteristics which allow effective filling of vias and contacts.

Copper metallization structures are often formed by a process known as Damascene, which is illustrated in FIG. 1a. An insulating layer known as the Interlevel Dielectric (ILD) separates metal layers in a multilevel metallization structure. ILD dielectric layer 2, which may be comprised of a bottom layer 4 and a top, low dielectric constant layer 6, has Damascene line regions 8 etched therein into which the metal lines will be inlaid. A barrier layer 10 is deposited, which serves to prevent diffusion of copper from the metal lines into the dielectric. This barrier layer is generally comprised of Ta or Ta compounds. A copper seed layer is then generally deposited, followed by an electroplated copper layer. The excess copper is then removed by a process known as Chemical Mechanical Polishing (CMP), leaving embedded copper lines 18, 20.

The integrity of the barrier layer 10 is critical to preventing diffusion of Cu into nearby dielectric or silicon regions. Diffused Cu in Si can cause degradation of device characteristics, such as leakage currents in reverse biased junctions. Cu defects in dielectrics can cause threshold voltage shifts and parasitic leakage currents. It is therefore essential to utilize methods for testing and/or monitoring barrier layer integrity. Barrier layer integrity tests can be utilized during development of barrier layer deposition processes, and they may be incorporated into manufacturing processes for monitoring during production.

In the prior art, barrier layer integrity has been evaluated by monitoring the line-to-line leakage current. In this method, unconnected, spaced apart copper lines are electrically stressed at higher electric field or temperature than would occur during normal circuit operation, and the leakage current between the lines is measured as an indication of copper diffusion through the barrier layer.

This prior art method for testing barrier layer integrity has inherent inaccuracies. Under temperature or voltage stress, Cu ions will diffuse across the lowest resistance path. The lowest resistance path may be a path which passes through the barrier layer, but it may instead be a path across the top dielectric surface, and accordingly falsely indicate lack of barrier layer integrity. In this prior art, a nitride capping layer 16 is generally deposited atop the Cu and dielectric surface to prevent the copper surface from oxidizing or corroding, and to isolate the copper line from the dielectric. One potential Cu diffusion path under stress is the nitride/dielectric interface. This effect is greatly magnified if conducting residues remain on the dielectric surface after CMP, due to incomplete polish or ineffective or insufficient post-CMP clean. Other sources of residues include improper processing of the nitride cap layer.

SUMMARY OF THE INVENTION

It is therefore an object of this invention to provide an improved structure and method for testing barrier integrity in an integrated circuit multilayer metallization structure.

It is a further object of this invention to provide a structure and method for testing barrier integrity which does not utilize measurement of line-to-line leakage current.

It is a further object of this invention to provide a structure and method for testing barrier integrity which is not subject to spurious leakage currents through paths other than through the barrier layer.

These objects are met by providing novel testing structures which provide a layer atop the dielectric layer and abutting the barrier layer, which has low permeability to copper. This low permeability layer, which may also be called a copper diffusion inhibitor layer, has copper permeability sufficiently low to inhibit copper from the metal lines or from conducting residues of the copper CMP from diffusing into the dielectric layer. The barrier layer integrity is then tested by performing CV or IV measurements across the ILD between the copper lines and the back of the silicon wafer.

DETAILED DESCRIPTION OF THE INVENTION

Figure 1A:
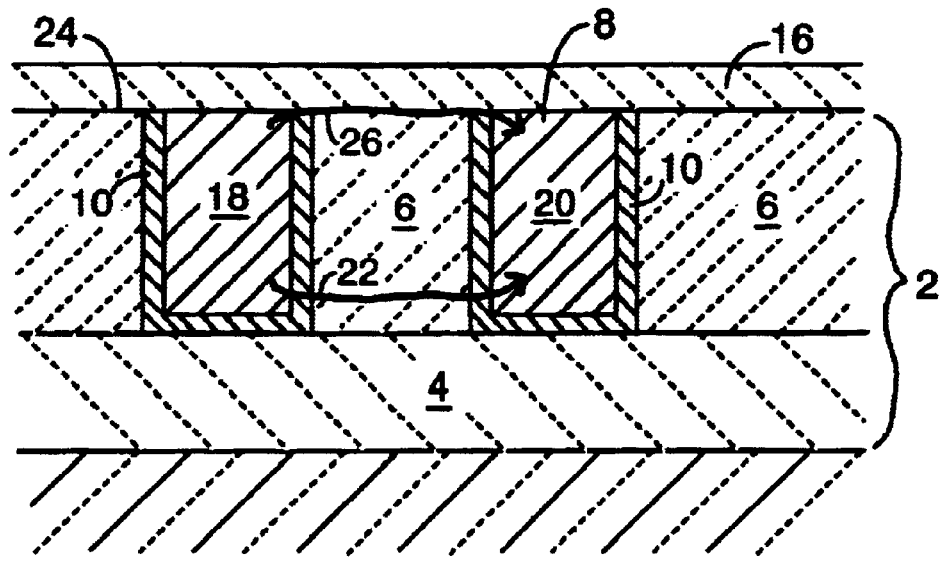
FIG. 1a shows a side cross sectional view of a typical Damascene structure.
Figure 1B:
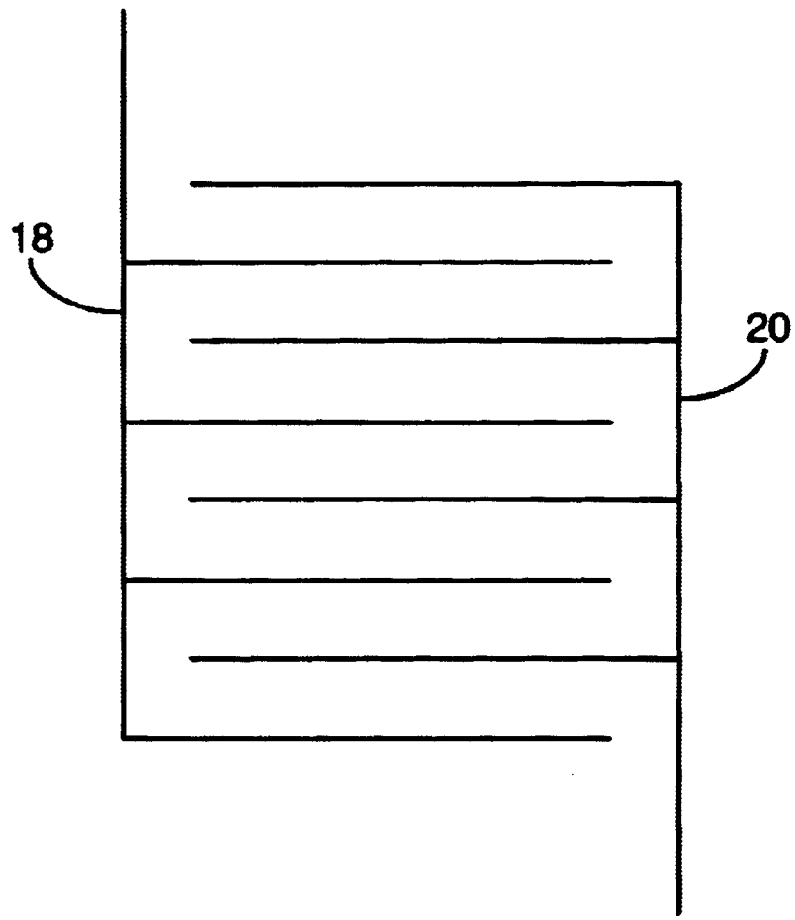
FIG. 1b shows a top view of metallization testing structures.

FIG. 1a illustrates the typical Damascene structure which has been used in prior barrier layer integrity tests. Leakage current is measured between first metal line 18 and second metal line 20. Leakage can occur through barrier layer 10 and dielectric 2, via leakage path 22. Alternately, leakage can occur along nitride/dielectric interface 24, via leakage path 26. Path 26 would have lower resistance, and thereby would be a more likely leakage path if conducting residue from Cu CMP were present at interface 24. Line-to-line leakage currents may be detected in this case, even though the barrier layer is intact. FIG. 1b shows a top view of a typical leakage test structure, showing lines 18 and 20 in an interleaving comb pattern to increase the available area for leakage to occur.

According to our invention, barrier layer integrity can be tested by measuring one of: leakage current, Capacitance-Voltage (C-V) characteristics, or Current-Voltage (I-V) characteristics vertically across the layers, between the copper line and the back of the silicon wafer, rather than measuring line-to-line leakage currents horizontally as in the prior art. Our invention provides test structures which prevent any conducting residues of the copper CMP from diffusing into the dielectric layer and which also inhibit diffusion of copper from the copper Damascene lines into the dielectric by any paths other than through the barrier layer. This is accomplished by providing a "low permeability" layer which has low permeability to copper diffusion atop the dielectric layer and abutting the barrier layer in the Damascene line region. Electrical characteristics are then measured vertically through the wafer rather than across its surface, which provides a better measure of copper ion diffusion through the barrier material into the dielectric.

Figure 2:
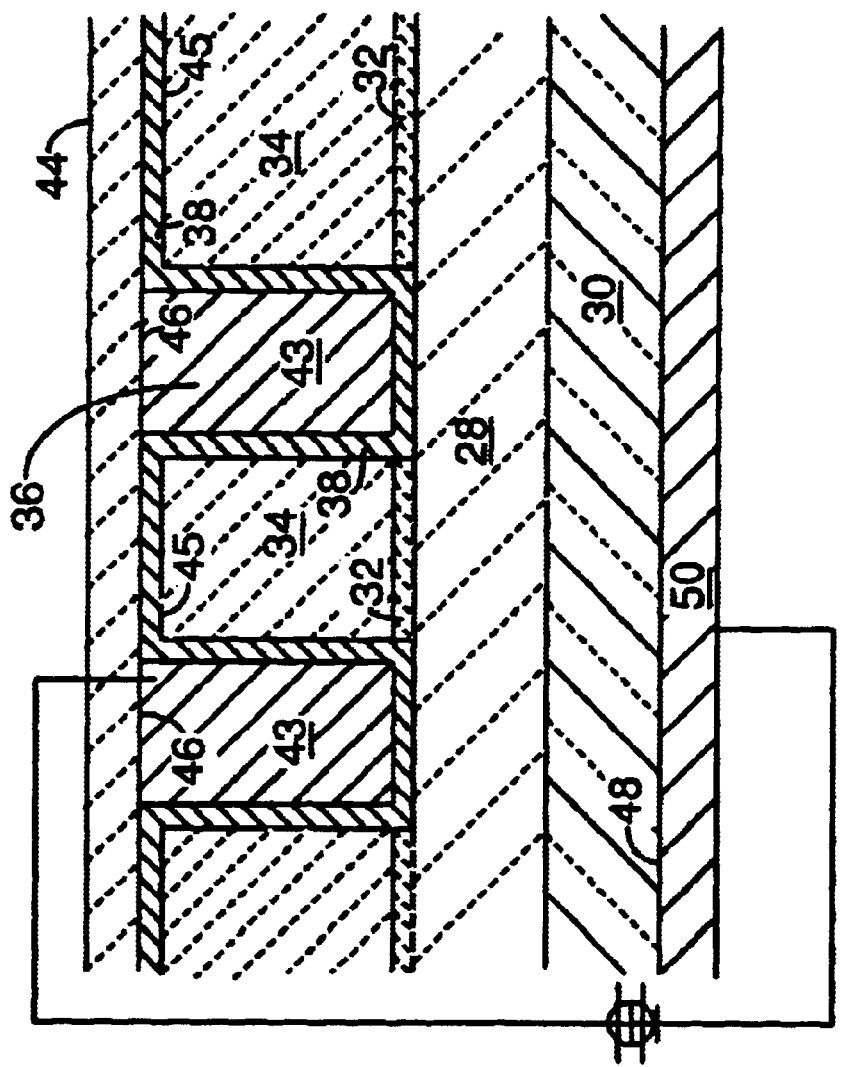
FIG. 2 shows a first embodiment of an inventive barrier layer integrity test structure.

FIG. 2 illustrates a first embodiment of our inventive method and our inventive structure for barrier layer integrity testing. The embodiment as shown is utilized with a single Damascene structure, but can be extended to a dual Damascene structure. The Damascene structure is formed according to known methods, as described hereinafter. Thin layer 28 of dielectric such as PETEOS, 2000 Angstroms thick by way of example with an expected acceptable range of 1000–5000 Angstroms, is deposited on silicon wafer 30. Thin nitride layer 32 with a thickness of 250–1000 Angstroms is deposited as an etch stop. Dielectric layer 34, 4000–5000 Angstrom thick PETEOS by way of example with an expected acceptable range of 1000–15000 Angstroms, is deposited atop nitride layer 32. Dielectric 34 is patterned and etched to provide Damascene lines 36 into which copper will be deposited, with the dielectric etch stopping at nitride etch stop layer 32. Nitride layer 32 is then removed from the Damascene line regions 36 with a second etching step. Barrier layer 38, generally with a thickness between 25–400 Angstroms, is next deposited. Barrier layer 38 is generally comprised of tantalum (Ta), but may also be comprised of titanium (Ti), titanium nitride, tantalum nitride, WN, WSiN, TaSiN, or TiSiN, deposited either by CVD or PVD. A copper seed layer is then deposited, followed by an electroplated copper layer which fills Damascene line regions 36 and which also is deposited atop barrier layer 38 atop dielectric 34. Post plating anneal to approximately 100 C to 450 C is performed. Copper CMP is then performed to removed excess copper from atop dielectric 34, leaving copper lines 43.

In conventional Damascene processing, the copper CMP polishes off both copper layer 42 and barrier layer 38 from the dielectric surface. In contrast, in the first embodiment of our inventive process, CMP is stopped on barrier layer 38, leaving the barrier intact atop the dielectric surface 45 in the field regions. Post-CMP capping layer 44, nitride by way of example, is deposited to prevent copper surface 46 from oxidizing. Metal 50 is deposited onto backside 48 of wafer 30 to enhance the substrate contact for C-V or leakage measurements. In order to test for diffusion of copper into the dielectric, copper lines 43 are subjected to bias temperature stressing while monitoring the leakage current or intermediate C-V or I-V characteristics between copper lines 43 and silicon wafer 30. The copper lines may be contacted in standard ways, such as by providing a large contact pad on the metal level having the aforementioned copper lines therein, the copper pad being electrically connected to the copper lines in question, then masking and opening a window in nitride capping layer 44 to expose the metal contact pad. Electrical testing is performed using such standard measurement hardware as the S900 Tester made by Keithley, and the HP 4071 Tester made by Hewlett-Packard.

According to this embodiment, the presence of the remaining intact barrier layer 38 atop dielectric surface 45 provides the aforementioned low permeability layer, and inhibits diffusion of copper into dielectric 34 except through barrier layer 38. There is no alternate low resistance diffusion path for copper which would affect the electrical measurements, in contrast to the prior art method of measuring line-to-line leakage. Therefore, the vertical electrical characteristics measured through the wafer rather than across its surface provide a better measure of copper ion diffusion through the barrier material into the dielectric.

Due to the presence of the conducting barrier layer material across the field regions, this embodiment is designed to be used for test or development wafers only, since line-to-line shorting would occur if this structure were formed on product wafers. As test structures, the copper lines 43 may be formed into long serpentine structures to increase the capacitance for ease of measurement.

Figure 3:
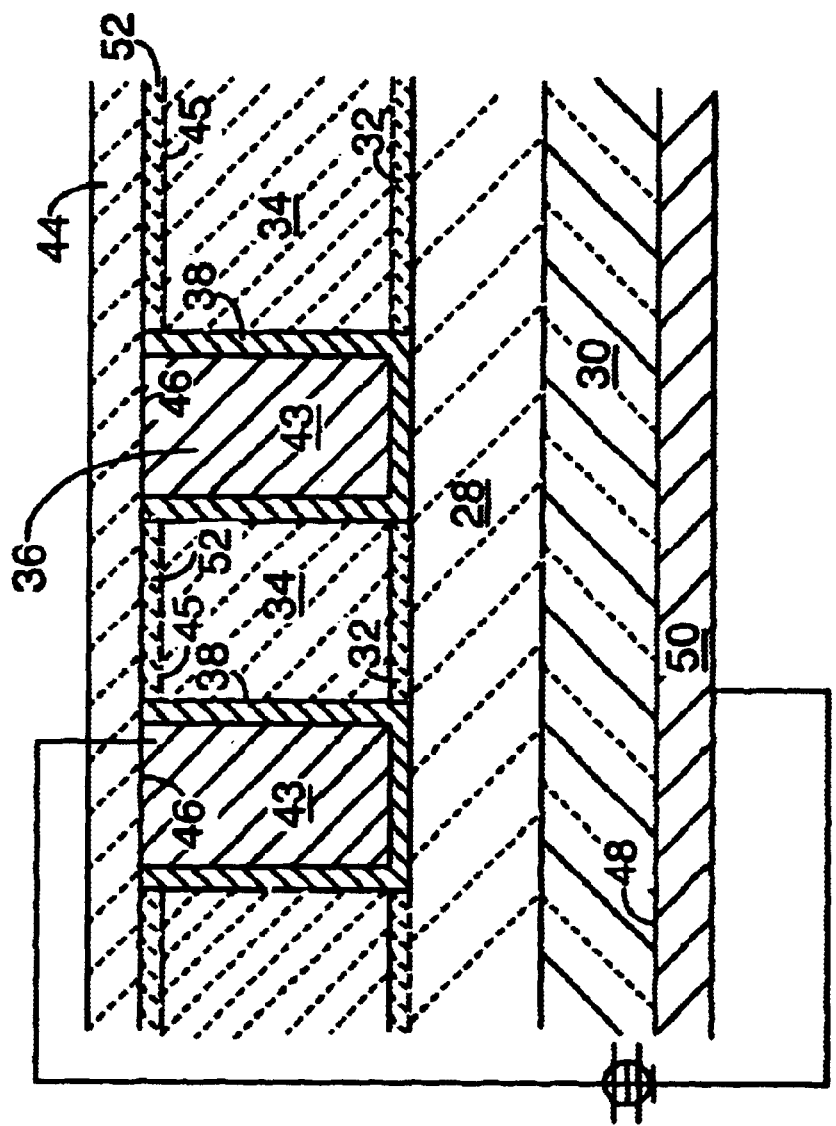
FIG. 3 shows a second embodiment of an inventive barrier layer integrity test structure.

FIG. 3 illustrates a second embodiment of our inventive method and structure for Ta barrier layer integrity testing. The embodiment as shown is utilized with a single Damascene structure, but can be extended to a dual Damascene structure.

The Damascene structure is formed similarly to the method of the first embodiment. Thin layer 28 of dielectric such as PETEOS, 2000 Angstroms thick by way of example with an expected acceptable range of 1000–5000 Angstroms, is deposited on silicon wafer 30. Thin nitride layer 32 with a thickness of 250–1000 Angstroms is deposited as an etch stop. Dielectric layer 34, 4000–5000 Angstrom thick PETEOS by way of example with an expected acceptable range of 1000–15000 Angstroms, is deposited atop nitride layer 32. A novel feature of this embodiment is that, subsequent to deposition of the thick dielectric layer 34, and prior to patterning of the dielectric, a thin nitride cap layer 52 of thickness 500–1000 Angstroms is deposited. Dielectric 34 is then patterned and etched to provide Damascene lines 36 into which copper will be deposited. Barrier layer 38 is next deposited. Barrier layer 38, generally with a thickness between 25–400 Angstroms, is generally comprised of Ta, but may also be comprised of titanium (Ti), titanium nitride, tantalum nitride, WN, WSiN, TaSiN, or TiSiN, or a combination of any of the aforementioned, deposited either by CVD or PVD. A copper seed layer is then deposited, followed by an electroplated copper layer which fills Damascene line regions 36 and which also is deposited atop barrier layer 38 atop dielectric 34. Post plating anneal to approximately 100 C to 450 C is performed. Copper CMP is then performed to removed excess copper and the barrier layer from atop dielectric 34, leaving copper lines 43. In this embodiment, in contrast to the first embodiment, the barrier layer 38 is removed by the CMP, and the CMP stops on nitride cap layer 52. A second, post-CMP cap layer 44, 500–1000 Angstroms of silicon nitride by way of example, is deposited to prevent copper surface 46 from oxidizing. Metal 50 is deposited onto backside 48 of wafer 30 to enhance the substrate contact for C-V or leakage measurements. Copper lines 43 are subjected to bias temperature stressing while monitoring the leakage current or intermediate C-V or I-V characteristics between copper lines 43 and silicon wafer 30.

According to this embodiment, the deposition of nitride capping layer 52 atop dielectric surface 45 prior to copper deposition and CMP provides the aforementioned low permeability layer, and inhibits diffusion of copper from copper lines 43 into dielectric 34, due to the very low diffusion rate of copper through silicon nitride. Similarly, the copper CMP residues and other impurities from copper deposition and anneal on the surface of nitride capping layer 52 are inhibited from diffusing into dielectric 34. There is no likely alternate lower resistance diffusion path for copper into the dielectric which would affect the vertical electrical barrier integrity measurements, in contrast to the prior art method of measuring line-to-line leakage. Therefore, the vertical electrical characteristics measured through the wafer rather than across its surface provide a better measure of copper ion diffusion through the barrier material into the dielectric.

In contrast to the structure of the first embodiment, in this embodiment there is no electrically conducting layer overlying the dielectric between metal lines. As a result, this embodiment may be utilized on product wafers as a structure that enables monitoring of barrier layer integrity. If it were desired to avoid having the nitride capping layer present on product circuit regions, a masking step could be employed to cover the test structures, and then the nitride capping layer could be etched off of the product regions. As test structures, the copper lines 43 may be formed into long serpentine structures to increase the capacitance for ease of measurement.

By utilizing our inventive structure and method, a much more reliable and unambiguous indication of barrier layer integrity can be obtained. This can assist both in development of barrier layer materials and deposition methods, but can also be used in production to monitor barrier layer integrity. The use of our inventive structure can also indirectly detect the presence of conduction CMP residues, by comparison of vertical electrical characteristics and line-to-line leakage.

It is not intended that our invention be restricted to the exact embodiments described herein. For example, different materials may be used for the dielectric or the barrier layer without altering the inventive concept. The scope of the invention should be construed in view of the claims.

With this in mind, we claim:

1. A structure for testing the integrity of a barrier layer underlying copper lines in a Cu metallization structure comprising:

a semiconductor substrate, said semiconductor substrate having a back surface;

a dielectric layer on said semiconductor substrate, said dielectric layer having a Damascene line region etched therein, said Damascene line region having a bottom surface and side surfaces, said dielectric layer having a top surface;

a barrier layer, said barrier layer being composed of a barrier layer material, said barrier layer being on said bottom and said side surfaces of said Damascene line region and filling a first portion of said Damascene line region, a remaining portion of said Damascene line region not being filled with said barrier layer;

said remaining portion of said Damascene line region filled with copper, said copper having a top surface;

a first cap layer, said first cap layer being contiguously atop said top surface of said copper and being atop said top surface of said dielectric layer;

a copper diffusion inhibitor layer having sufficiently low permeability to copper diffusion to inhibit copper from diffusing therethrough, said copper diffusion inhibitor layer being contiguous to and atop said top surface of said dielectric layer, said copper diffusion inhibitor layer also being contiguous to and below said first cap layer;

said copper diffusion inhibitor layer abutting said barrier layer on said side surfaces of said Damascene line region, and said copper diffusion inhibitor layer being removed from atop said copper;

a first electrical contact to said top surface of said copper and a second electrical contact to said back surface of said semiconductor substrate for enabling electrical characteristic measurement between said first and second electrical contacts indicative of integrity of said barrier layer;

said copper diffusion inhibitor layer being comprised of a material selected from the group consisting of: Ta, CVD Ta, CVD Ti, CVD TiN, CVD TaN, CVD WN, CVD WSiN, CVD TaSiN, CVD TiSiN, PVD Ta, PVD Ti, PVD TiN, PVD TaN, PVD WN, PVD WSiN, PVD TaSiN, PVD TiSiN, and combinations thereof, and silicon nitride.

2. The structure of claim 1, wherein said barrier layer has a thickness in the range of 25–400 Angstroms, and wherein said barrier layer material is selected from the group consisting of:

CVD Ta, CVD Ti, CVD Titanium Nitride, CVD Tantalum Nitride, CVD WN, CVD WSiN, CVD TaSiN, CVD TiSiN, PVD Ta, PVD Ti, PVD Titanium Nitride, PVD Tantalum Nitride, PVD WN, PVD WSiN, PVD TaSiN, PVD TiSiN, and combinations thereof.

3. The structure of claim 2, wherein said barrier layer is Ta.

4. The structure of claim 1, wherein said first cap layer comprises silicon nitride and has a thickness in the range between 500–1000 Angstroms.

5. A structure for testing the integrity of a barrier layer underlying copper lines in a Cu metallization structure comprising:

a semiconductor substrate, said semiconductor substrate having a back surface;

a dielectric layer on said semiconductor substrate, said dielectric layer having a Damascene line region etched therein, said Damascene line region having a bottom surface and side surfaces, said dielectric layer having a top surface;

a barrier layer, said barrier layer being composed of a barrier layer material, said barrier layer being on said bottom and said side surfaces of said Damascene line region and filling a first portion of said Damascene line region, a remaining portion of said Damascene line region not being filled with said barrier layer;

said remaining portion of said Damascene line region filled with copper, said copper having a top surface;

a first cap layer, said first cap layer being contiguously atop said top surface of said copper and being atop said top surface of said dielectric layer;

a copper diffusion inhibitor layer having sufficiently low permeability to copper diffusion to inhibit copper from diffusing therethrough, said copper diffusion inhibitor layer being contiguous to and atop said top surface of said dielectric layer, said copper diffusion inhibitor layer also being contiguous to and below said first cap layer;

said copper diffusion inhibitor layer abutting said barrier layer on said side surfaces of said Damascene line region, and said copper diffusion inhibitor layer being removed from atop said copper;

a first electrical contact to said top surface of said copper and a second electrical contact to said back surface of said semiconductor substrate for enabling electrical characteristic measurement between said first and second electrical contacts indicative of integrity of said barrier layer;

wherein said dielectric layer includes a first portion underlying said Damascene line region and a second portion not underlying said Damascene line region, and wherein said second portion not underlying said Damascene line region includes a first dielectric layer, an etch stop layer atop said first dielectric layer, and a second dielectric layer atop said etch stop layer.

6. The structure of claim 5, wherein said second portion not underlying said Damascene line region comprises:
   a first PETEOS layer;
   said etch stop layer being a silicon nitride layer atop said first PETEOS layer; and
   a second PETEOS layer atop said etch stop layer.

7. The structure of claim 6, wherein
   said first PETEOS layer has a thickness in the range between 1000 and 5000 Angstroms;
   said silicon nitride etch stop layer has a thickness in the range between 250 and 1000 Angstroms; and
   said second PETEOS layer has a thickness in the range between 1000 and 15000 Angstroms.

8. A structure for testing the integrity of a barrier layer underlying copper lines in a Cu metallization structure comprising:
   a semiconductor substrate, said semiconductor substrate having a back surface;
   a dielectric layer on said semiconductor substrate, said dielectric layer having a Damascene line region etched therein, said Damascene line region having a bottom surface and side surfaces, said dielectric layer having a top surface;
   a barrier layer, said barrier layer being composed of a barrier layer material, said barrier layer being on said bottom and said side surfaces of said Damascene line region and filling a first portion of said Damascene line region, a remaining portion of said Damascene line region not being filled with said barrier layer;
   said remaining portion of said Damascene line region filled with copper, said copper having a top surface;
   a first cap layer, said first cap layer being contiguously atop said top surface of said copper and being atop said top surface of said dielectric layer;
   a copper diffusion inhibitor layer having sufficiently low permeability to copper diffusion to inhibit copper from diffusing therethrough, said copper diffusion inhibitor layer being contiguous to and atop said top surface of said dielectric layer, said copper diffusion inhibitor layer also being contiguous to and below said first cap layer;
   said copper diffusion inhibitor layer abutting said barrier layer on said side surfaces of said Damascene line region, and said copper diffusion inhibitor layer being removed from atop said copper;
   a first electrical contact to said top surface of said copper and a second electrical contact to said back surface of said semiconductor substrate for enabling electrical characteristic measurement between said first and second electrical contacts indicative of integrity of said barrier layer;
   wherein said electrical contact to said back surface of said semiconductor substrate comprises a metal layer on said back surface of said substrate and an electrical contact to said metal layer.

9. The structure of claim 1, wherein said copper diffusion inhibitor layer is comprised of said barrier layer material and thereby forms an extension of said barrier layer atop said top surface of said dielectric layer.

10. A structure for testing the integrity of a barrier layer underlying copper lines in a Cu metallization structure comprising:
    a semiconductor substrate, said semiconductor substrate having a back surface;
    a dielectric layer on said semiconductor substrate, said dielectric layer having a Damascene line region etched therein, said Damascene line region having a bottom surface and side surfaces, said dielectric layer having a top surface;
    a barrier layer, said barrier layer being composed of a barrier layer material, said barrier layer being on said bottom and said side surfaces of said Damascene line region and filling a first portion of said Damascene line region, a remaining portion of said Damascene line region not being filled with said barrier layer;
    said remaining portion of said Damascene line region filled with copper, said copper having a top surface;
    a first cap layer, said first cap layer being contiguously atop said top surface of said copper and being atop said top surface of said dielectric layer;
    a copper diffusion inhibitor layer having sufficiently low permeability to copper diffusion to inhibit copper from diffusing therethrough, said copper diffusion inhibitor layer being contiguous to and atop said top surface of said dielectric layer, said copper diffusion inhibitor layer also being contiguous to and below said first cap layer;
    said copper diffusion inhibitor layer abutting said barrier layer on said side surfaces of said Damascene line region, and said copper diffusion inhibitor layer being removed from atop said copper;
    a first electrical contact to said top surface of said copper and a second electrical contact to said back surface of said semiconductor substrate for enabling electrical characteristic measurement between said first and second electrical contacts indicative of integrity of said barrier layer;
    wherein said copper diffusion inhibitor layer comprises a second cap layer, said second cap layer abutting and being contiguous with said first barrier layer portion on said side surfaces of said Damascene region, said second cap layer being removed from atop said copper, said second cap layer and said copper having said barrier layer on said side surfaces of said Damascene region disposed therebetween.

11. The structure of claim 10, wherein said second cap layer comprises silicon nitride and has a thickness in the range between 500 and 1000 Angstroms.

12. The structure of claim 11 further including impurities between said first cap layer and said second cap layer.

13. The structure of claim 9, formed by a method comprising the steps of:
    depositing a dielectric layer onto said semiconductor substrate;
    etching a patterned Damascene line region into said dielectric layer, said Damascene line region having a bottom surface and sidewall surfaces;
    depositing a barrier layer atop said dielectric layer and onto said bottom and sidewall surfaces of said Damascene line region;
    forming a copper layer atop said barrier layer, said copper layer filling said Damascene line region, a first portion of said copper layer being atop said barrier layer atop said dielectric layer, a second portion of said copper layer being atop said barrier layer on said bottom surface of said Damascene line region;
    Chemically-Mechanically-Polishing (CMP) said copper layer until said portion of said copper layer atop said barrier layer atop said dielectric layer is removed, said second portion of said copper layer atop said barrier layer on said bottom surface of said Damascene line region remaining and having a top surface;

said CMP stopping on said barrier layer atop said dielectric layer such that said barrier layer atop said dielectric layer remains intact;

depositing a first cap layer atop said top surface of said second portion of said copper layer and atop said barrier layer atop said dielectric layer; and forming an electrical contact on said back surface of said wafer.

14. The structure of claim 13, wherein:

said barrier layer is Ta, and said first cap layer is silicon nitride.

15. The structure of claim 10, formed by the process comprising the steps of:

depositing a dielectric layer onto said substrate;

depositing a second cap layer onto said dielectric layer;

etching a patterned Damascene line region through said second cap layer and into said dielectric layer, said Damascene line region having a bottom surface and sidewall surfaces;

depositing a barrier layer atop said dielectric layer and onto said bottom and sidewall surfaces of said Damascene line region;

forming a copper layer atop said barrier layer, said copper layer filling said Damascene line region, a portion of said copper layer being atop said barrier layer atop said dielectric layer;

Chemically-Mechanically-Polishing (CMP) said copper layer and said barrier layer until said portion of said copper layer atop said barrier layer atop said dielectric layer is removed and until said barrier layer atop said dielectric layer is removed;

said CMP stopping on said second cap layer atop said dielectric layer such that said second cap layer atop said dielectric layer remains intact;

depositing a first cap layer atop said top surface of said second portion of said copper layer and atop said second cap layer atop said dielectric layer; and forming an electrical contact on said back surface of said wafer.

16. The structure of claim 15, wherein:

said barrier layer is Ta, and said first and second cap layers are silicon nitride.

17. The structure of claim 5, wherein said barrier layer has a thickness in the range of 25–400 Angstroms, and wherein said barrier layer material is selected from the group consisting of:

Ta, CVD Ta, CVD Ti, CVD TiN, CYD TaN, CVD WN, CVD WSiN, CVD TaSiN, CVD TiSiN, PVD Ta, PVD Ti, PVD TiN, PVD TaN, PVD WN, PVD WSiN, PVD TaSiN, PVD TiSiN, and combinations thereof.

18. The structure of claim 17, wherein said barrier layer is Ta.

19. The structure of claim 5, wherein said first cap layer comprises silicon nitride and has a thickness in the range between 500–1000 Angstroms.

20. The structure of claim 9, wherein said extension of said barrier layer atop said top surface of said dielectric layer has a thickness in the range of 25–400 Angstroms and is comprised of a material selected from the group consisting of:

CVD Ta, CVD Ti, CVD Titanium Nitride, CVD Tantalum Nitride, CVD WN, CVD WSiN, CVD TaSiN, CVD TiSiN, PVD Ta, PVD Ti, PVD Titanium Nitride, PVD Tantalum Nitride, PVD WN, PVD WSiN, PVD TaSiN, PVD TiSiN, and combinations thereof.

* * * * *